United States Patent [19]

Thompson et al.

[11] Patent Number: 4,540,226
[45] Date of Patent: Sep. 10, 1985

[54] INTELLIGENT ELECTRONIC CONNECTION SOCKET

[75] Inventors: Raymond W. Thompson, Sugarland; Navinchandra Kalidas, Houston; John H. Abbott, Missouri City; David S. Laffitte, Houston, all of Tex.

[73] Assignee: Texas Instruments Incorporated, Dallas, Tex.

[21] Appl. No.: 455,183

[22] Filed: Jan. 3, 1983

[51] Int. Cl.³ .................................. H01R 23/72
[52] U.S. Cl. ........................ 339/17 CF; 361/401; 361/414
[58] Field of Search ............ 339/17 C, 17 M, 17 CF, 339/17 N; 361/414, 395, 401, 403; 29/841

[56] References Cited

U.S. PATENT DOCUMENTS 3,340,439  9/1967  Henschen et al. ............ 339/17 CF
3,512,255  5/1970  Hayden et al. .................... 29/841
4,342,069  7/1982  Link ................................ 361/403

Primary Examiner—Neil Abrams
Attorney, Agent, or Firm—Robert D. Marshall, Jr.; N. Rhys Merrett; Melvin Sharp

[57] ABSTRACT

An electronic connection socket for connecting an electronic package and including a body of nonconductive material, an electronic device fabricated upon a semiconductor substrate located upon the body. The electronic device includes several bonding pads. The socket includes a set of pins to provide interconnection to external electronic devices. The body also includes pin sockets providing interconnection to the electronic package. The pins and pin sockets of the body are also connected to the bonding pads of the electronic device. To provide the electrical interconnection between the electronic package, the electronic device located upon the semiconductor substrate in the socket body and the external circuitry connected to the body.

6 Claims, 12 Drawing Figures

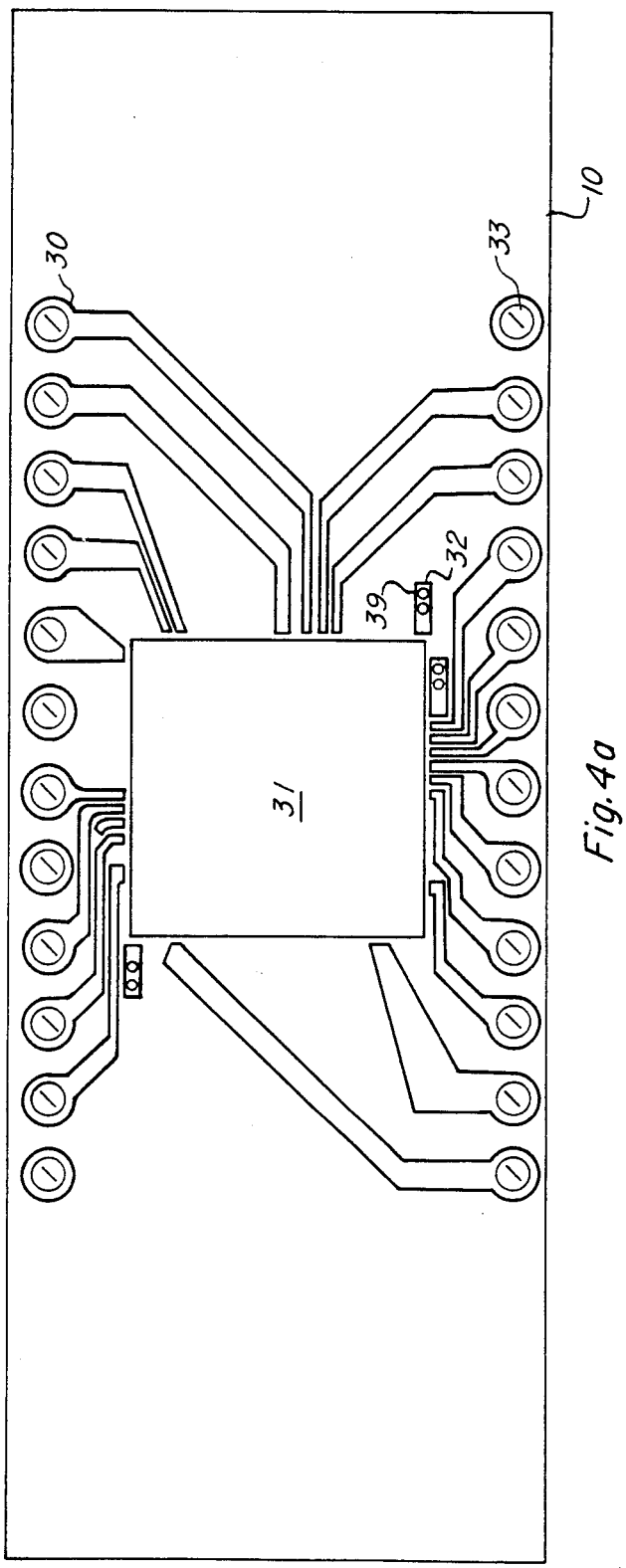

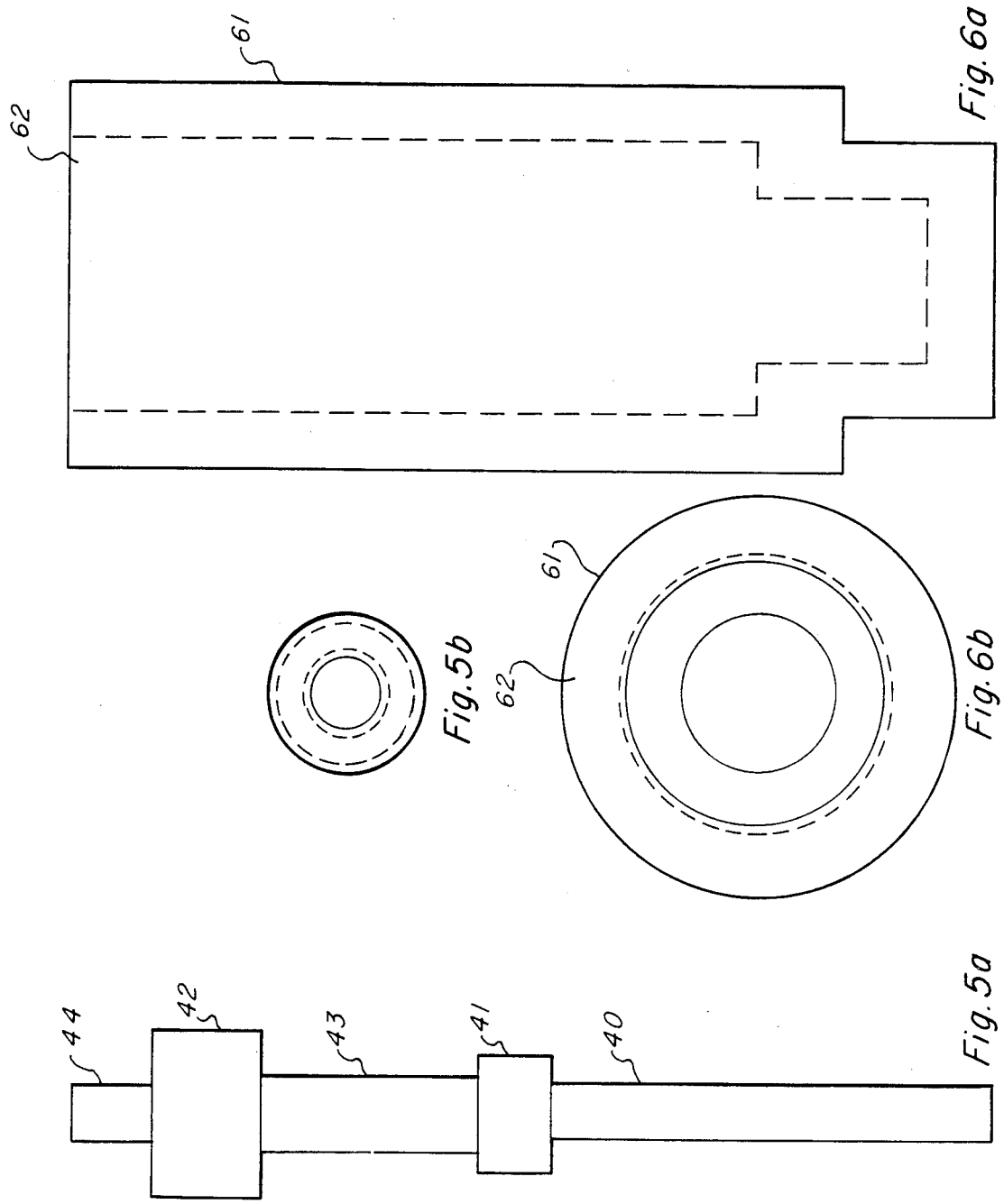

INTELLIGENT ELECTRONIC CONNECTION SOCKET

BACKGROUND OF THE INVENTION

1. Field of the Invention

This invention relates to electronic device sockets and more specifically to electronic circuitry implemented within electronic sockets.

2. Description of the Prior Art

Electronic sockets serve a mechanical and an electrical purpose. The mechanical purpose is to provide mechanical support for electronic devices fabriated as packages. The most common implementation is the use of a socket for dual inline package to provide mechanical support for the dual inline package in a printed circuit board. The prior art socket consists of a body of nonconducting material with pins and pin sockets. The pin sockets receive the pins of the dual inline package, and these pins of the socket provide the connection to the printed circuit board. The socket is usually soldered to the printed circuit board, becoming permanently fixed. The dual inline package containing the electronic device, however, can be installed and removed from the socket without altering the socket connection to the printed circuit board. The socket then allows for the ease of electrical connection of the electronic dual inline package to the electronic devices contained on the printed circuit board. These sockets, therefore, do not provide any true electronic function other than the mechanical support and electrical connection of the electronic device contained in the dual inline package to the printed circuit board.

More recently microprocessors package in dual inline packages have been produced to receive read-only memories (ROM) to provide the programmation. This piggy back arrangement allows for the alteration of programs for execution in the microprocessor. However, the microprocessor still requires a socket to provide mechanical support and electrical interconnection to the circuit board.

U.S. Pat. No. 4,342,069 entitled, "Integrated Circuit Package" by Joseph Link assigned to Mostek Corporation, describes an integrated semiconductor package that is capable of supporting a separate integrated circuit package. The integrated circuit package subscribed in this patent, however, is not an integrated circuit socket as described in the present invention. The patented integrated circuit package does include pin sockets on the top surface of the package itself that connect to an itegrated circuit contained within the package. The integrated circuit is also connected to pins which extend beneath the integrated circuit package.

SUMMARY OF THE INVENTION

In accordance with the present invention, an electronic connection socket for connecting an electronic package is provided that includes a body of nonconductive material containing an electronic device located upon a semiconductor substrate. The electronic device includes several bonding pads. The semiconductor substrate containing the electronic device is contained within the body of the socket. The body further includes interconnection capability for providing electrical connection to external electronic devices. The body further includes interconnection capability to interconnect to the electronic package being received by the socket. The body further includes the interconnection between bonding pads and selected pins and pin sockets to provide for the total interconnection of the electronic package with the electronic device contained on the semiconductor substrate in the socket body and further to any external electronic devices.

In a preferred embodiment, an electronic connection socket is provided that includes a body of nonconductive material containing pins that permit the socket to be placed upon a printed circuit board and electrically connected to the printed circuit board by soldering the pins to the printed circuit board foil terminals. The socket further includes an electronic device fabricated upon a semiconductor substate. The electronic device includes several bonding pads. The socket includes several pin sockets to receive the electronic package. Conductive leads are provided on the socket body to interconnect the bonding pads of the electronic device to selected pins and/or pin sockets.

In an additional preferred embodiments, an electronic connection socket is provided that includes a digital processing system fabricated upon a semiconductor substrate. The semiconductor substrate is located upon a body of nonconductive material. The additional processing system includes bonding pads located upon the semiconductor substrate. These bonding pads are connected to pins that provide for the electrical connection of the digital processing system to electronic devices external to the socket. These bonding pads are also connected to several socket pins that are provided to receive the electronic package for the socket, and a still further embodiment, the electronic package includes programming information for the digital processing system.

BRIEF DESCRIPTION OF THE DRAWINGS

The novel features believed characteristics of the invention are set forth in the appended claims. The invention itself, however, as well as other features and advantages thereof will be best understood by reference to detailed descriptions which follow when read in conjunction with the accompanying drawings, wherein:

FIG. 4a is a top view of the top printed circuit board.

FIG. 5a is a side view of the socket pin.

FIG. 5b is a cross sectional view showing the diameters of the socket pin.

FIG. 6a is a side view of the intelligent socket pin receiving socket.

FIG. 6b is a top view of the pin receiving socket.

DESCRIPTION OF THE PREFERRED EMBODIMENT

Figure 1:
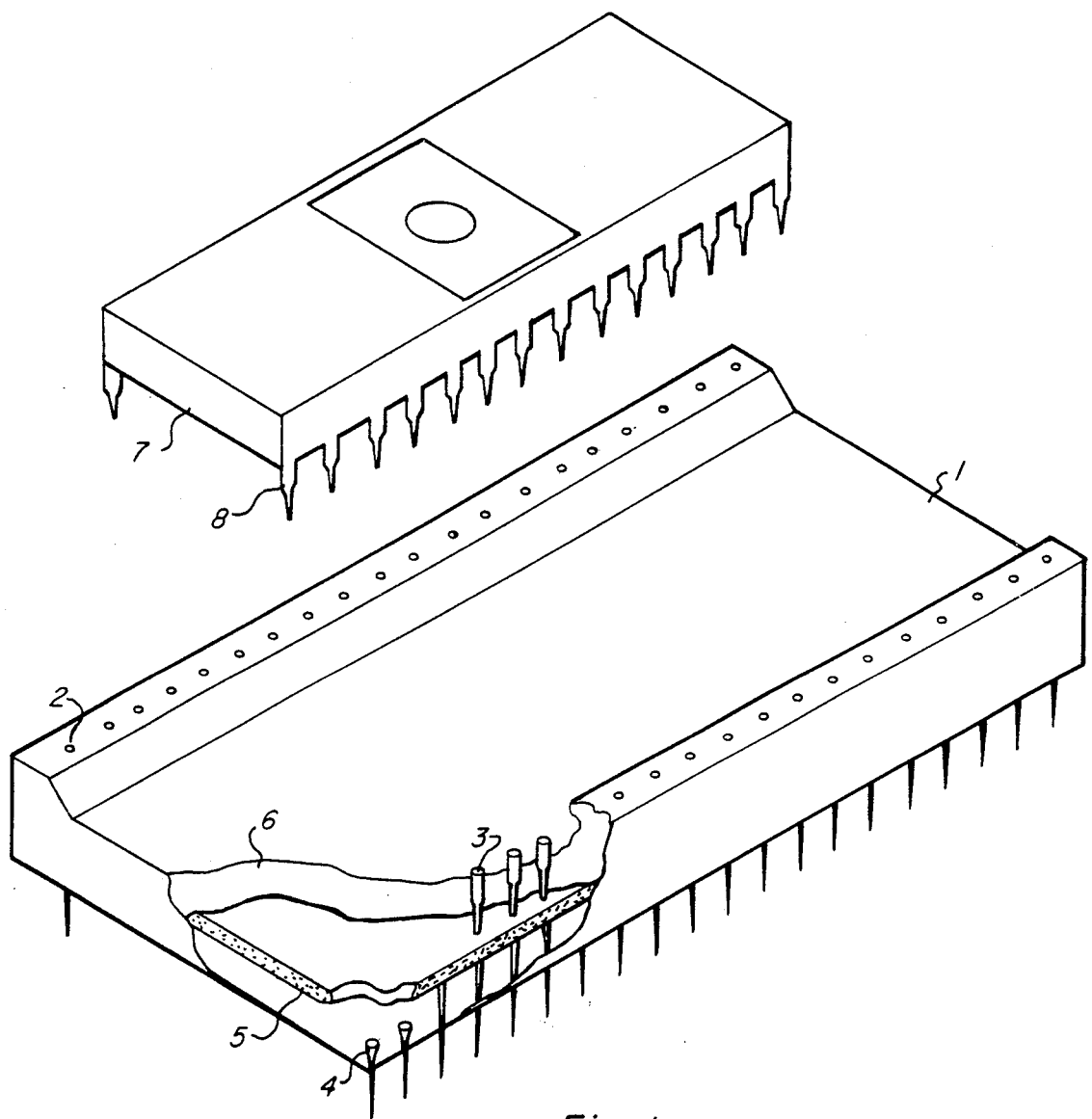
FIG. 1 is an illustration including a cutaway drawing of the intelligent socket of the present invention, together with an integrated circuit package located above this socket.

This specification describes an integrated circuit socket suitable for use in printed circuit boards. FIG. 1 illustrates a typical example of this invention. The socket 1 contains several openings on the sides 2 to receive pins 8 from an external device 7. The pins 8 of this external device 7 are physically joined to pin sockets contained within socket 1. The covering material of socket 1 shown as 6 may be plastic, ceramic or an appropriate molded material that allows thermal cooling of the contents of socket 1 and an external device 7. External device 7 is shown as an EPROM (an Erasable Programmed Read-Only Memory). However, the present invention may employ any external integrated circuit contained in a dual inline package. The internal circuitry 5 contained within socket 1 provides electrical interconnection to the pin sockets 3 and the pins 4.

Figure 2:
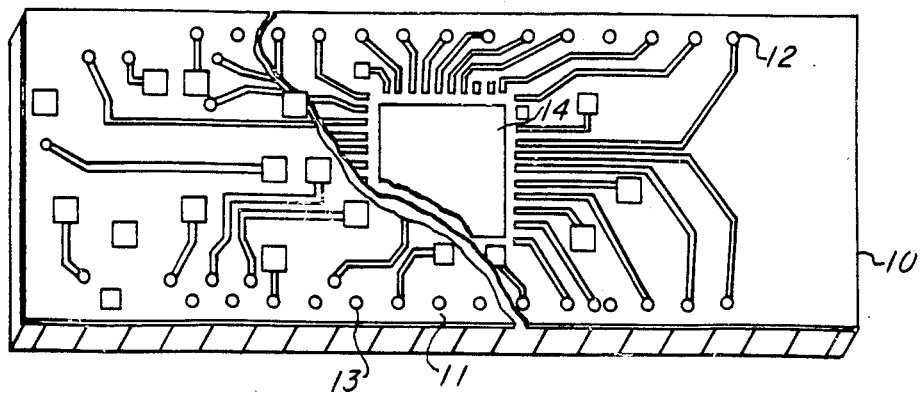
FIG. 2 is a cutaway illustration of the printed circuit boards included in the intelligent socket.

FIG. 2 illustrates this internal circuitry. FIG. 2 illustrates two printed circuit board structures 10 and 11 together as a single circuit board. A portion of the top circuit board 10 has been cut away to reveal the lower circuit board 11. Both circuit boards 10 and 11 contain pin socket holes 12 and 13, respectively to receive pin sockets as illustrated in FIG. 1. Area 14 in FIG. 2 is fabricated to receive an integrated circuit substrate.

Figure 3A:
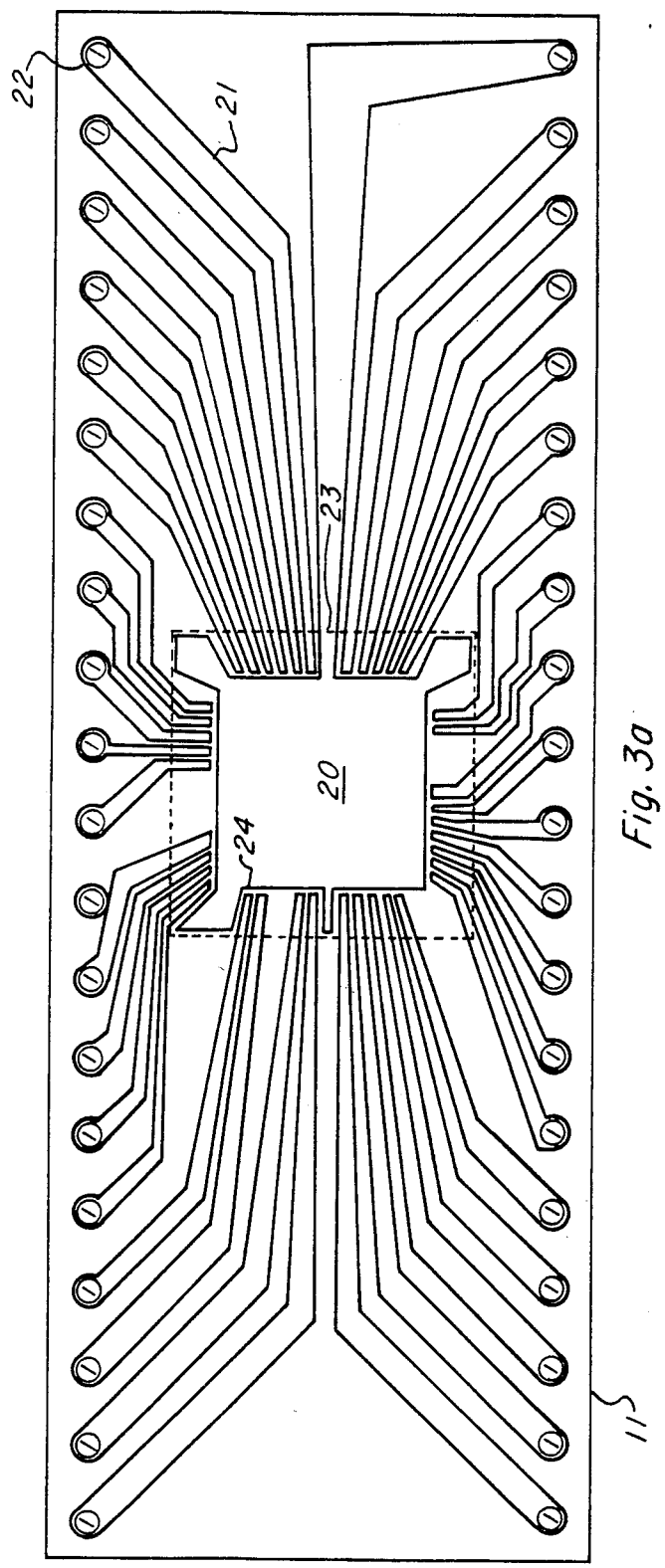
FIG. 3a is a top view of the bottom printed circuit board.
Figure 3B:
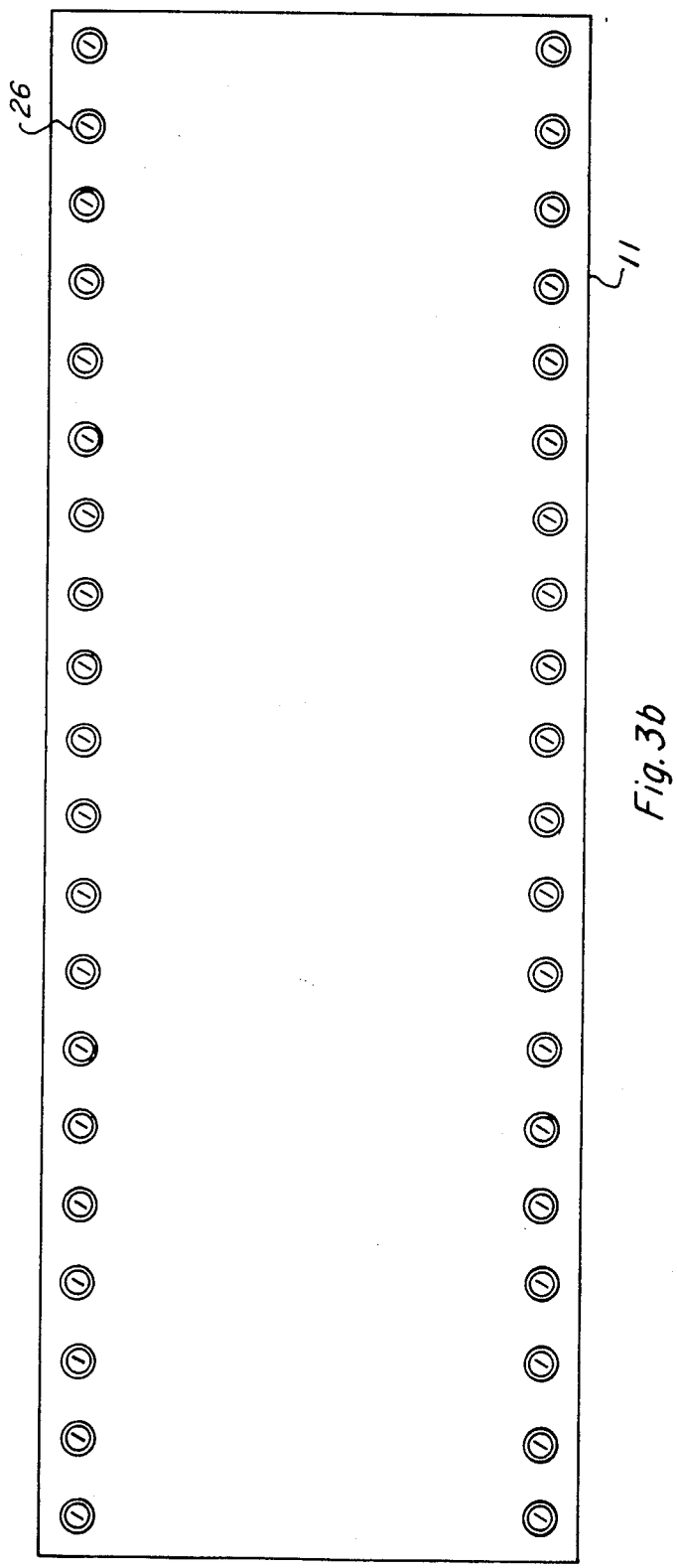
FIG. 3b is a bottom view of the bottom printed circuit board.

FIG. 3a is a top view of the bottom board 11 as shown in FIG. 2. Circuit board 11 includes several metal fingers that have been adhered to the surface of the circuit board and provide electrical connection between the holes 22 and an integrated circuit substrate that is placed in area 20. The integrated circuit placed in area 20 is bonded to the fingers 21 so that the finger termination point is near the integrated circuit area 20 such as location 24. This structure enables the integrated circuit bonding pads to be bonded to the metal fingers 21 to be connected to pins that may be selectively connected through holes such as 22. An outer perimeter 23 is marked on the circuit board 11 to illustrate the open area of the second circuit board 10 as illustrated in FIG. 2 when placed on top of circuit FIG. 3b illustrates a bottom view of circuit board 11. This view of the circuit board 11 includes hole 26 which correspond to the holes 22 on the top side. The holes 26 include a metal bushing to facilitate connection with pins that extend from the bottom of the circuit board and outward through the socket.

Figure 3C:
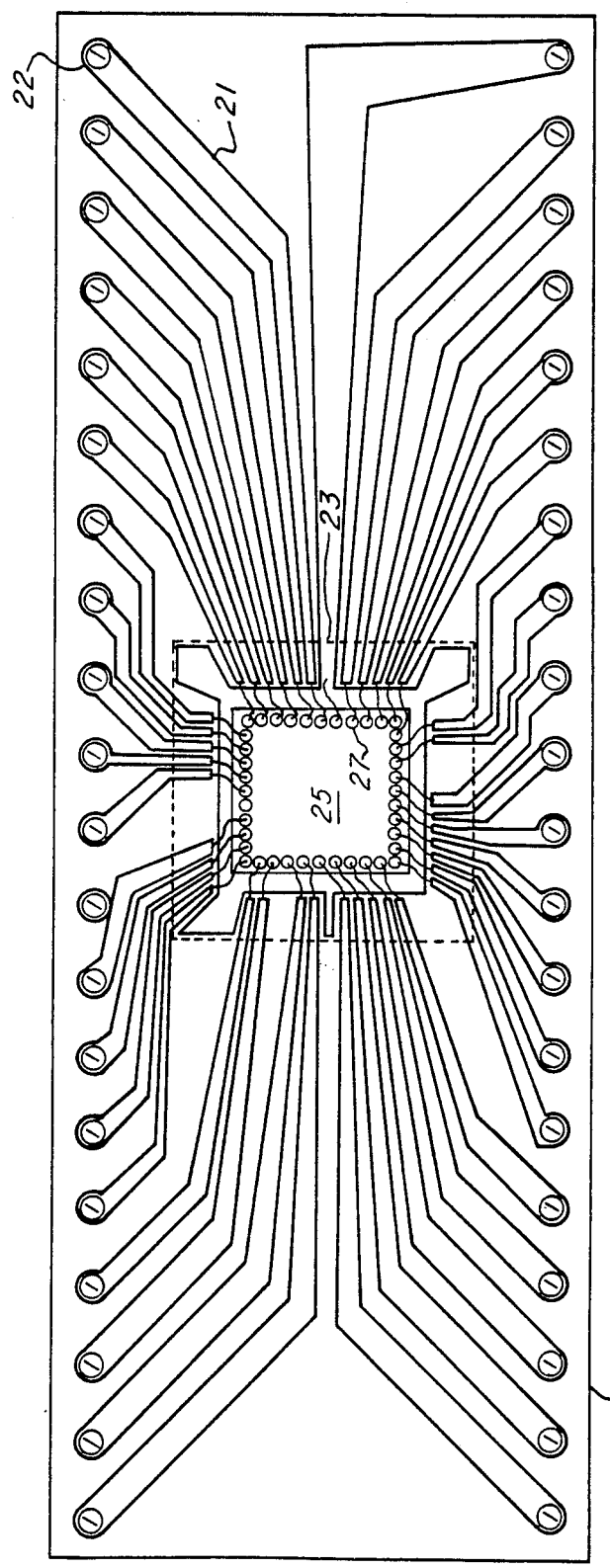
FIG. 3c is a top view of the bottom printed circuit board illustrating the connection of the integrated circuit.

FIG. 3c is a top view of circuit board 11 further showing the connections to the integrated circuit substrate. The integrated circuit includes substrate 25 mounted within area 20. Substrate 25 has a plurality of bonding pads 27 which are employed to couple circuits within the integrated circuit to external components. These bonding pads 27 are coupled to metal fingers 21 via small bonding wires 28. By this means, the integrated circuit is connected to other circuits. It will be clearly understood by those skilled in the art that substrate 25 and bonding wires 28 described above are conventional.

Figure 4B:
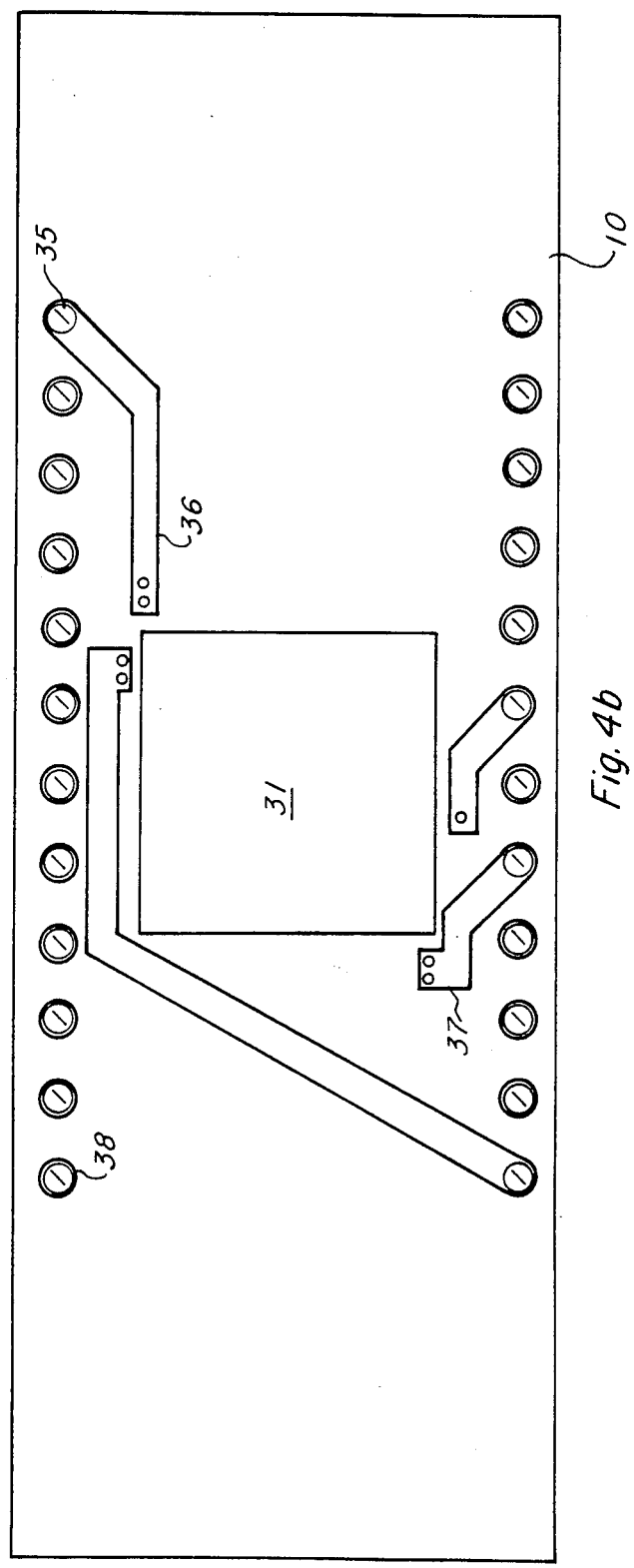
FIG. 4b is a bottom view of the top circuit board.

FIG. 4a illustrates the top view of the top circuit board. Circuit board 10 is similar to circuit board 11 in that it contains metal fingers such as 30 connected to holes that provide interconnection to the pin sockets as illustrated in FIG. 1. The vacant area 31 corresponds to the area 20 in FIG. 3a. When circuit board 10 is assembled on top of circuit board 11 separated by an insulating layer not shown, the bonding pads of the integrated circuit substrate placed in area 20 of FIG. 3a are bonded to the metal fingers located on circuit board 10 such as 30. This bonding allows the integrated circuit in area 20 of FIG. 3a to be interfaced to both circuit boards 11 and circuit board 10. In addition, the top view of circuit board 10 illustrates several rectangular metal deposits such as 32 contain plated-through holes 39 that provide interconnection to the bottom side of circuit board 10. Certain holes on the top surface of circuit board 10 such as 33 are shown not connected to the circuit board. These holes may allow interconnection to the circuit board 11 beneath circuit board 10 in the final structure or may provide no connection at all with any of the circuitry contained on either circuit board 10 or circuit board 11 and provide a straight path from the pin socket to the pin extending beneath the socket assembly. FIG. 4b illustrates the bottom side of the top circuit board 10. Note that the fingers 36 and 37 contained on the bottom side are connected to holes toward the pins or pin sockets but are not bonded directly to any integrated circuit contained in the open area 31. This bonding is provided on the top side of circuit board 10 as shown in FIG. 4a. For example, referring to FIG. 4a, the substrate in area 31 is bonded to the bonding area 32. A plated-through hole 39 provides interconnection to the bottom side illustrated in 4b. Specifically, hole 39 provides an electrical interconnection to metal strip 37 as shown. The bottom side of circuit board 10 also contains holes such as 38 that are not connected to any of the metal strips on circuit board 10.

FIG. 5a is a side view of the socket pin shown as 4 in FIG. 1. This pin consists of a pin shaft 40 that extends below the socket assembly and two locking pins 41 and 42 of diameters greater than the pin shafts to provide restricted vertical movement of the pin in the socket package. These locking pins 41 and 42 also restrict the rotational motion of the pin in the socket package. The area of the shaft 43 connects the two locking pins 42 and 41. The area 44 above locking pin 42 provides electrical interconnection to the circuit boards. FIG. 5b is the top view of the pin in FIG. 5a.

The pin socket shown as 3 in FIG. 1 is illustrated in FIGS. 6a and 6b. Both of these Figures are greatly exagerated views of the pin socket 61. FIG. 6a is a side view of the pin socket 61 showing the vacant area 62 internal to the pin socket 61 itself for receiving a pin from an external circuit package. FIG. 6a is a top view of the pin socket 61.

Figure 7:
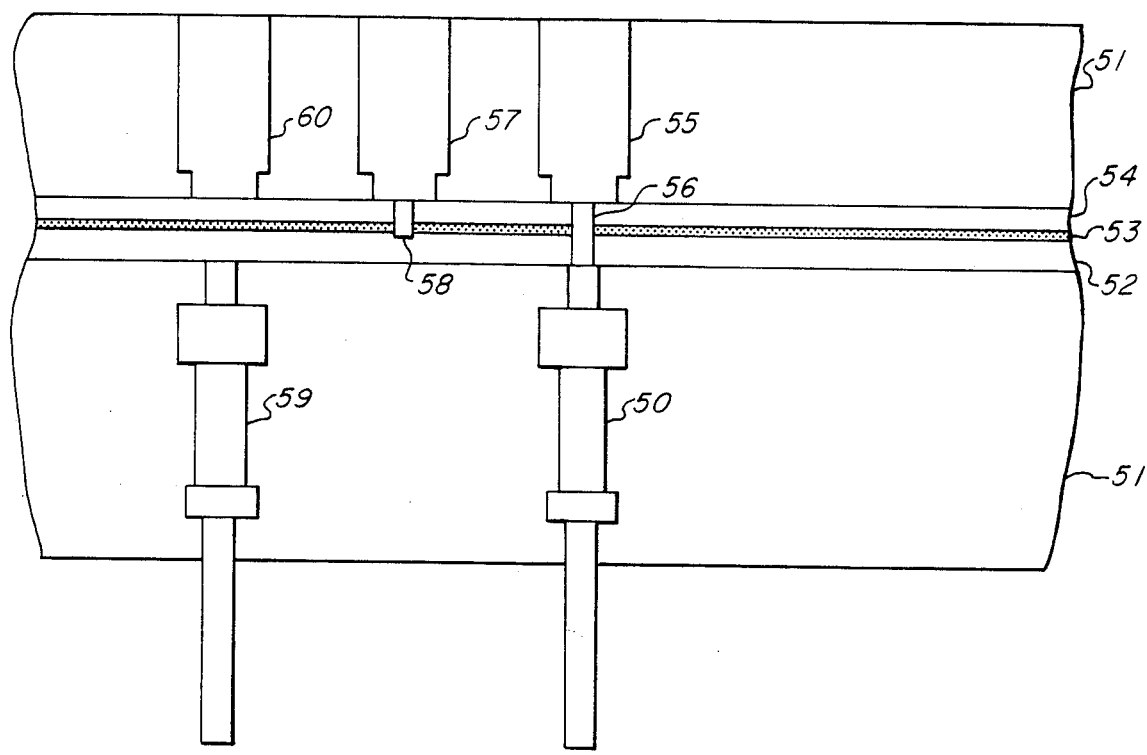
FIG. 7 is a cutaway sectional view of the intelligent socket including the pin receiving sockets, printed circuit board and pins.

The assembly of pins and pin sockets with the circuit boards in the package is illustrated in FIG. 7. FIG. 7 is a side cross-sectional view of a section of the pin socket illustrating three types of connections between the circuit board, pin sockets and pins. The socket assembly 51 is shown including first circuit board 54 located above an insulating layer 53 which is in turn located above a second circuit board 52. Both these circuit boards are bonded to at least one integrated circuit as illustrated in FIGS. 3, 3a, 3b and FIGS. 4a and 4b. Pin socket 55 is connected to the top circuit board 54 and to the pin 50 through a plated-through hole structure 56. This structure allows pin socket 55 to be connected to both circuit boards 54 and 52 through insulating layer 53 and to the socket pin 50. The second type of interconnection that may be provided is illustrated by pin socket 57 being connected to circuit board 52 by the plated-through hole structure 58. In this structure, the pin socket 57 may or may not be connected to the top circuit board 54. The third type is illustrated by pin socket 60 being connected to the top circuit board 54 and pin 59 being connected to the bottom circuit board 52. These separate assemblies, allow pins from an external device to be either connected directly to the pin of the socket such as in the structure pin socket 55 to pin 50 or connected to only one circuit board pin socket 57 or connected to a pin through circuitry contained on the circuit boards and integrated circuit. In this last example, pin socket 60 would connect the pin of the external device to a portion of the integrated circuit which would interface this signal to circuitry upon the integrated circuit and transmit the signal to pin 59 through another portion of the lower circuit board 52. Therefore there would be no direct interconnection between pin socket 60 and pin 59. It should be obvious to one skilled in the art that using this configuration would enable a signal from the external device pin to be transferred through to the socket pin or to be intercepted and used by the circuitry on the printed circuits boards contained within the socket itself, or alternatively to be processed and relayed to a pin contained in the socket. It should also be obvious to one skilled in the art that both circuit boards may separately or together contain more than one integrated circuit substrate, and the plated-through hole circuitry on the boards together with external interface to signals between the boards together with signals from the pin sockets or from the socket pins themselves. This arrangement will provide for increased density of integrated circuits upon a single printed circuit board. In addition, this structure may provide for a microprocessor emulator where the programmation for a microprocessor would be contained in an EPROM that would be plugged into the socket.

We claim:

1. An electronic connection socket for connection of an external electronic package, said socket comprising:
   a first circuit board (11) having a plurality of first connection holes (22), a first central aperture (20) and a plurality of connection fingers (21) selectively disposed between said first connection holes and the perimeter (23) of said first central aperture;
   a semiconductor electronic device (25) disposed in said first central aperture of said first circuit board having a plurality of bonding pads (27) connected to selected connection fingers at said perimeter of said first central aperture by bonding wires (28);
   a plurality of first interconnection means (4) aligned with said first connection holes for connection of said socket to external electronic devices;
   a plurality of second interconnection means (3) aligned with said first connection holes for connection of said socket to the connection pins of an external electronic package;
   a plurality of third interconnection means (56, 58) aligned with said first connection holes for selectively connecting said connection fingers, said first interconnection means and said second interconnection means;
   a second circuit board disposed in a plane parallel to the plane of said first circuit board having first and second surfaces, a plurality of second connection holes (33) aligned with said first connection holes, a second central aperture (31) aligned with said first central aperature, a plurality of plated through holes (39) connecting said first and second surfaces of said second circuit board, a plurality of first surface connection fingers (30) disposed on said first surface of second circuit board and connecting at least one of said second connection holes and one of said plated through holes, at least one of said first surface connection fingers having portions disposed near the periphery of said second central aperture and bonded to said bonding pads of said semiconductor integrated device and a plurality of second surface connection fingers (36, 37) disposed on said second surface and connecting at least one of said second connection holes and one of said plated through holes;
   an insulating layer (53) disposed between said first circuit board and said second circuit board; and
   a body (6) of nonconducting material surrounding and encapsulating said first circuit board, said second circuit board, said semiconductor electronic device and said first, second and third interconnection means.

2. An electronic connection socket according to claim 1, wherein said body is fabricated to provide cooling of said semiconductor electronic device.

3. An electronic connection socket according to claim 2, wherein said body includes a ceramic material upon which the semiconductor electronic device is located.

4. An electronic connection socket according to claim 1, wherein said first interconnection means includes a plurality of pins to provide interconnection of said socket to a printed circuit board.

5. Electronic connection socket according to claim 1 wherein said first interconnection means includes a plurality of pins to provide wire wrap interconnection to external electronic devices.

6. An electronic connection socket according to claim 1 wherein said second interconnection means includes a plurality of pin sockets for receiving pins from a package.

* * * * *